US012563754B2

(12) United States Patent
Chan et al.

(10) Patent No.: US 12,563,754 B2
(45) Date of Patent: Feb. 24, 2026

(54) HYBRID DECOUPLING CAPACITOR AND METHOD FORMING SAME

(71) Applicant: Taiwan Semiconductor Manufacturing Co., Ltd., Hsinchu (TW)

(72) Inventors: Hao-Chieh Chan, Hsinchu (TW); Chung-Hui Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 609 days.

(21) Appl. No.: 17/655,431

(22) Filed: Mar. 18, 2022

(65) Prior Publication Data

US 2022/0208957 A1 Jun. 30, 2022

Related U.S. Application Data

(63) Continuation of application No. 16/709,464, filed on Dec. 10, 2019, now Pat. No. 11,289,569, which is a
(Continued)

(51) Int. Cl.
*H10D 1/68* (2025.01)
*H01L 21/762* (2006.01)
(Continued)

(52) U.S. Cl.
CPC ....... *H10D 1/692* (2025.01); *H01L 21/76224* (2013.01); *H01L 23/5223* (2013.01); *H10D 1/66* (2025.01); *H10D 1/716* (2025.01); *H10D 30/024* (2025.01); *H10D 30/62* (2025.01);

*H10D 64/017* (2025.01); *H10D 84/0158* (2025.01); *H10D 84/038* (2025.01); *H10D 84/212* (2025.01); *H10D 84/811* (2025.01);
(Continued)

(58) Field of Classification Search
CPC ......... H01L 21/823431; H01L 23/5223; H01L 27/0629; H01L 27/0886; H01L 28/40; H01L 28/60; H01L 28/90; H01L 29/66795; H01L 29/785; H10D 1/692; H10D 30/024; H10D 30/62; H10D 84/158; H10D 84/212; H10D 84/215; H10D 84/811; H10D 84/834; H10D 84/0158
See application file for complete search history.

(56) References Cited

U.S. PATENT DOCUMENTS

2004/0099924 A1 5/2004 Nakata et al.
2004/0175910 A1 9/2004 Pan et al.
(Continued)

*Primary Examiner* — Nelson Garces
(74) *Attorney, Agent, or Firm* — Slater Matsil, LLP

(57) ABSTRACT

A device includes a first capacitor and a second capacitor connected to the first capacitor in parallel. The first capacitor includes a semiconductor region and a first plurality of gate stacks. The first plurality of gate stacks comprise a plurality of gate dielectrics over and contacting the semiconductor region, and a plurality of gate electrodes over the plurality of gate dielectrics. The second capacitor includes an isolation region, a second plurality of gate stacks over the isolation region, and a plurality of conductive strips over the isolation region and parallel to the second plurality of gate stacks. The second plurality of gate stacks and the plurality of conductive strips are laid out alternatingly.

20 Claims, 12 Drawing Sheets

Related U.S. Application Data continuation of application No. 15/966,406, filed on Apr. 30, 2018, now Pat. No. 10,510,826.

(60) Provisional application No. 62/525,916, filed on Jun. 28, 2017.

(51) Int. Cl.

| | | |
|---|---|---|
| *H01L 23/522* | (2006.01) | |
| *H10D 1/66* | (2025.01) | |
| *H10D 30/01* | (2025.01) | |
| *H10D 30/62* | (2025.01) | |
| *H10D 64/01* | (2025.01) | |
| *H10D 84/00* | (2025.01) | |
| *H10D 84/01* | (2025.01) | |
| *H10D 84/03* | (2025.01) | |
| *H10D 84/80* | (2025.01) | |
| *H10D 84/83* | (2025.01) | |
| *H10D 89/10* | (2025.01) | |

(52) U.S. Cl.
CPC ......... *H10D 84/834* (2025.01); *H10D 84/215* (2025.01); *H10D 89/10* (2025.01)

(56) References Cited

U.S. PATENT DOCUMENTS

| | | | |
|---|---|---|---|
| 2010/0078695 A1 | 4/2010 | Law et al. | |
| 2013/0200449 A1* | 8/2013 | Chen | H10D 30/0243 |
| | | | 257/E21.409 |
| 2013/0228866 A1* | 9/2013 | Lee | H10D 84/0158 |
| | | | 257/E27.06 |
| 2016/0133758 A1* | 5/2016 | Wright | H10D 1/64 |
| | | | 257/596 |
| 2017/0301766 A1 | 10/2017 | Ichijoh | |

* cited by examiner

HYBRID DECOUPLING CAPACITOR AND METHOD FORMING SAME

PRIORITY CLAIM AND CROSS-REFERENCE

This application is a continuation of U.S. patent application Ser. No. 16/709,464, entitled "Hybrid Decoupling Capacitor and Method Forming Same," filed Dec. 10, 2019, which is a continuation of U.S. patent application Ser. No. 15/966,406, entitled "Hybrid Decoupling Capacitor and Method Forming Same," filed Apr. 30, 2018, now U.S. Pat. No. 10,510,826 issued Dec. 17, 2019, which claims the benefit of U.S. Provisional Application No. 62/525,916, filed Jun. 28, 2017, and entitled "Hybrid Decoupling Capacitor Layouts," which applications are hereby incorporated herein by reference.

BACKGROUND

Capacitors are used to form integrated circuits. There are a plurality of different capacitors. For example, Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip applications, different capacitors for different functional circuits are integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
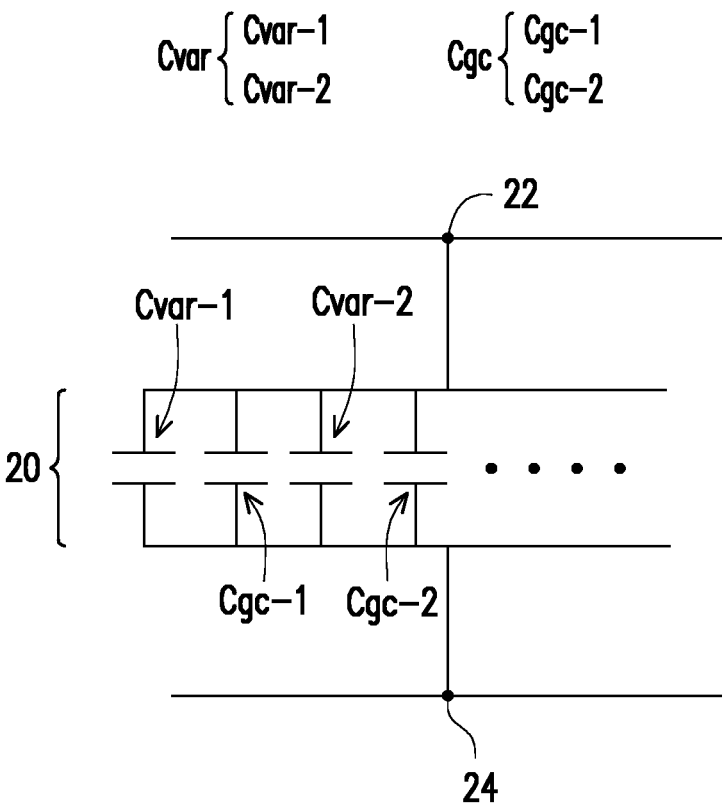
FIG. 1 illustrates a schematic diagram of a hybrid decoupling capacitor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A hybrid decoupling capacitor and the method of forming the same are provided in accordance with various exemplary embodiments. The layout and the cross-sectional views of the hybrid decoupling capacitor are illustrated in accordance with some embodiments. Some variations of some embodiments are discussed. Throughout the various views and illustrative embodiments, like reference numbers are used to designate like elements.

Decoupling capacitors are used to decouple some parts of electrical networks from others. FIG. 1 illustrates a schematic diagram of hybrid decoupling capacitor 20 in accordance with some embodiments of the present disclosure. Hybrid decoupling capacitor is connected between nodes 22 and 24. Nodes 22 and 24 may be signal nodes, power supply nodes, or the like. In accordance with some embodiments of the present disclosure, one of nodes 22 and 24 is a signal node, and the other is a negative power supply node VSS. In accordance with alternative embodiments of the present disclosure, nodes 22 and 24 are both signal nodes carrying signals rather than power supply voltages. For example, nodes 22 and 24 may carry complementary signals. Noise caused by certain circuit elements and applied on nodes 22 and 24 is shunted through decoupling capacitor 20, hence reducing the effect of the noise-generating circuit elements on adjacent circuits.

In accordance with some embodiments of the present disclosure, decoupling capacitor 20 is coupled between power supply nodes. For example, one of nodes 22 and 24 may be the positive power supply node VDD, and the other may be negative power supply node VSS. The respective power supply providing the power supply voltages VDD and VSS thus may accommodate the variations in current-draw, so that the variation in the power supply voltage is minimized. When the current-draw in a device changes, and the power supply itself cannot respond to the change instantaneously, decoupling capacitor 20 may act as a power storage to maintain power supply voltages in response to the current-draw at frequencies ranging from hundreds of kilo-hertz to hundreds of mega-hertz. Decoupling capacitor 20, depending on the usage, may need to have a high capacitance, and hence may occupy a significant chip area.

Decoupling capacitor 20 in accordance with some embodiments of the present disclosure is a hybrid capacitor that includes two types of capacitors connected in parallel to provide great capacitance. The two types of capacitors have different structures. FIG. 1 illustrates that decoupling capacitor 20 includes a plurality of capacitors Cvar-1, Cvar-2, . . . , etc. of a first type, which are varactors. Capacitors Cvar-1, Cvar-2, etc. are individually and collectively referred to as capacitors Cvar, wherein the term "var" represents varactors. Decoupling capacitor 20 also includes a plurality of capacitors Cgc-1, Cgc-2, . . . of a second type, which are capacitors formed with interdigited gate electrodes and contact plugs. Capacitors Cgc-1, Cgc-2, etc. are individually and collectively referred to as capacitors Cgc, in which letter "g" represents gate electrodes, and letter "c" represents contact plugs. The capacitance of hybrid decoupling capacitor 20 is the sum of all capacitors Cvar and Cgc.

Figure 2:
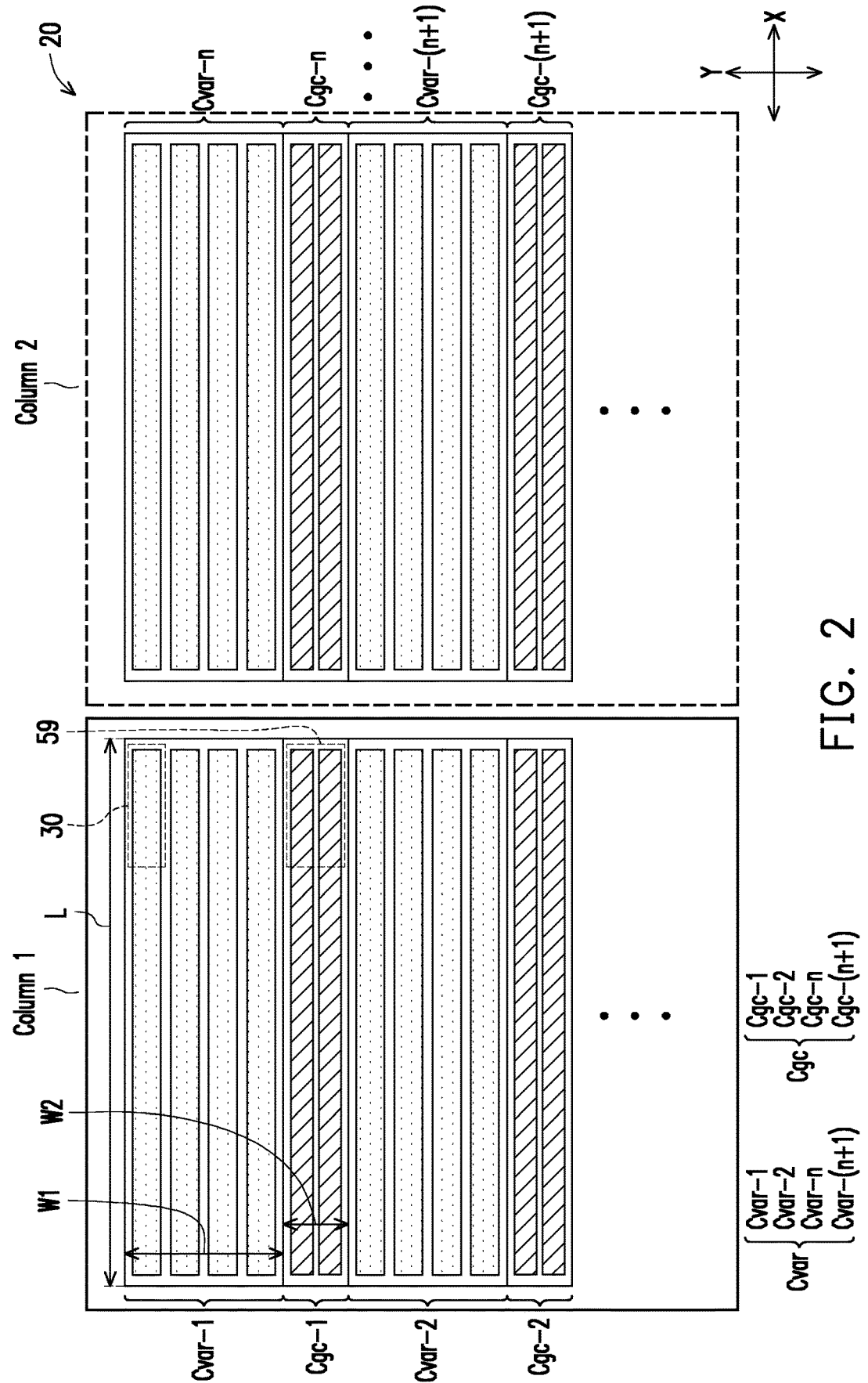
FIG. 2 illustrates a schematic layout of a hybrid decoupling capacitor in accordance with some embodiments.

FIG. 2 schematically illustrates a schematic layout (the top view) of some parts of decoupling capacitor 20. In accordance with some embodiments of the present disclosure, decoupling capacitor 20 includes a plurality of capacitors Cvar-1, Cvar-2, etc. and capacitors Cgc-1, Cgc-2, etc. aligned as a column (for example, column 1). Capacitors Cvar and capacitors Cgc are laid out in the column alternatingly. The total number of both capacitors Cvar and Cgc is selected depending on the capacitance of individual capacitors Cvar and Cgc and the desirable capacitance of decoupling capacitor 20.

In accordance with some embodiments of the present disclosure, capacitors Cvar and Cgc have the same length L. The width W1 of the plurality of capacitors Cvar may be equal to each other. The width W2 of the plurality of capacitors Cgc may be equal to each other. Width W1 may be equal to or greater than width W2. In a certain chip area, the density of active regions cannot exceed certain value. Otherwise, the process for manufacturing the decoupling capacitor may have problems. The maximum value of the density of the active regions is specified in design rules. In accordance with some embodiments of the present disclosure, the width W1 may be designed so that the density of the active regions in capacitors Cvar is equal to or slightly smaller than the maximum value allowed by design rules. For example, width W1 may be smaller than about 6 μm, and may be in the range between about 5 μm and about 6 μm.

Next to capacitors Cvar are capacitors Cgc. Capacitors Cgc are free from active regions. Accordingly, forming capacitors Cgc immediately next to capacitors Cvar has the benefit of reducing the overall density of active regions in the combined area of capacitors Cvar and Cgc. On the other hand, since capacitors Cgc have high densities of contact plugs and gate electrodes, as will be discussed subsequently, forming capacitors Cvar, which have low density of contact plugs and gate electrodes, next to capacitors Cgc also has the function of reducing the density of contact plugs and gate electrodes. In accordance with some embodiments of the present disclosure, the capacitance of capacitors Cvar per unit chip area is higher than the capacitance of capacitors Cgc per unit chip. Accordingly, the width W2 of capacitors Cgc may be as small as possible, as long as the density of active regions, contact plugs, and gate electrodes may meet design rules. In accordance with some embodiments of the present disclosure, width W2 is smaller than about 3 μm, and may be in the range between about 1.5 μm and about 3 μm. Also, ratio W1/W2 may be in the range between about 2 and about 4 in accordance with some embodiments.

Figure 3A:
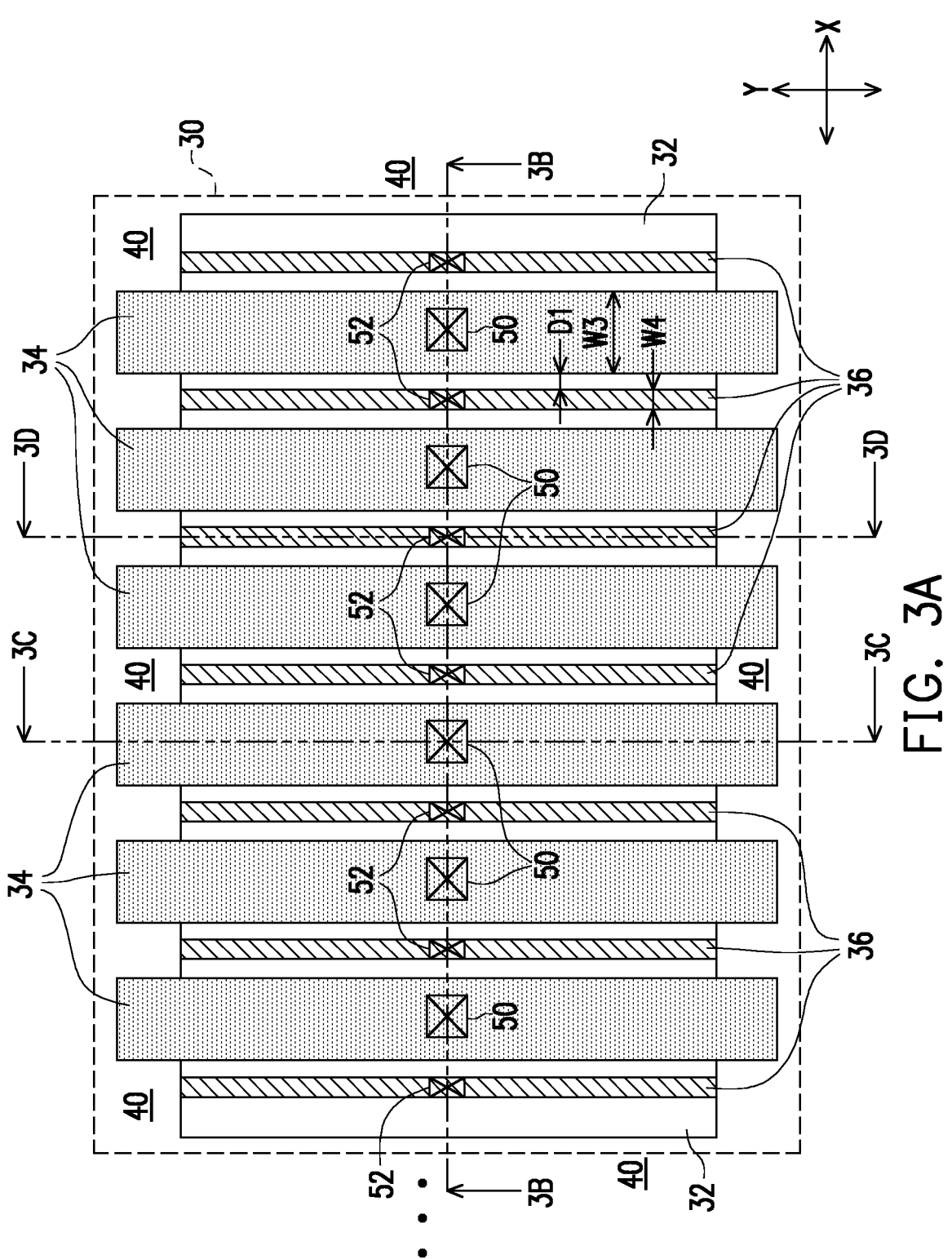
FIGS. 3A, 3B, 3C, and 3D illustrate the top view and cross-sectional views of a varactor in a hybrid decoupling capacitor in accordance with some embodiments.

FIG. 3A illustrates an amplified top view of a portion of capacitor Cvar. The illustrated portion is obtained from the region 30 as shown in FIG. 2. As shown in FIG. 3A, active region 32 (a semiconductor region) is elongated, and has a lengthwise direction extending in X direction (row direction in FIG. 2). Active regions 30 are encircled by, and hence their boundaries are defined by, Shallow Tranche Isolation (STI) regions 40. A plurality of gate stacks 34 are formed as elongated strips, and have lengthwise directions extending in Y direction (column direction in FIG. 2). Gate spacers (not shown) may be formed on the opposite sides of gate stacks 34. A plurality of contact plugs 36 are formed as elongated strips, and also have lengthwise directions extending in the Y direction. Gate stacks 34 and contact plugs 36 are allocated alternatingly. A plurality of contact plugs 50 are formed over and electrically connected to gate stacks 34. A plurality of contact plugs 52 are formed over and electrically connected to contact plugs 36.

Figure 3B:
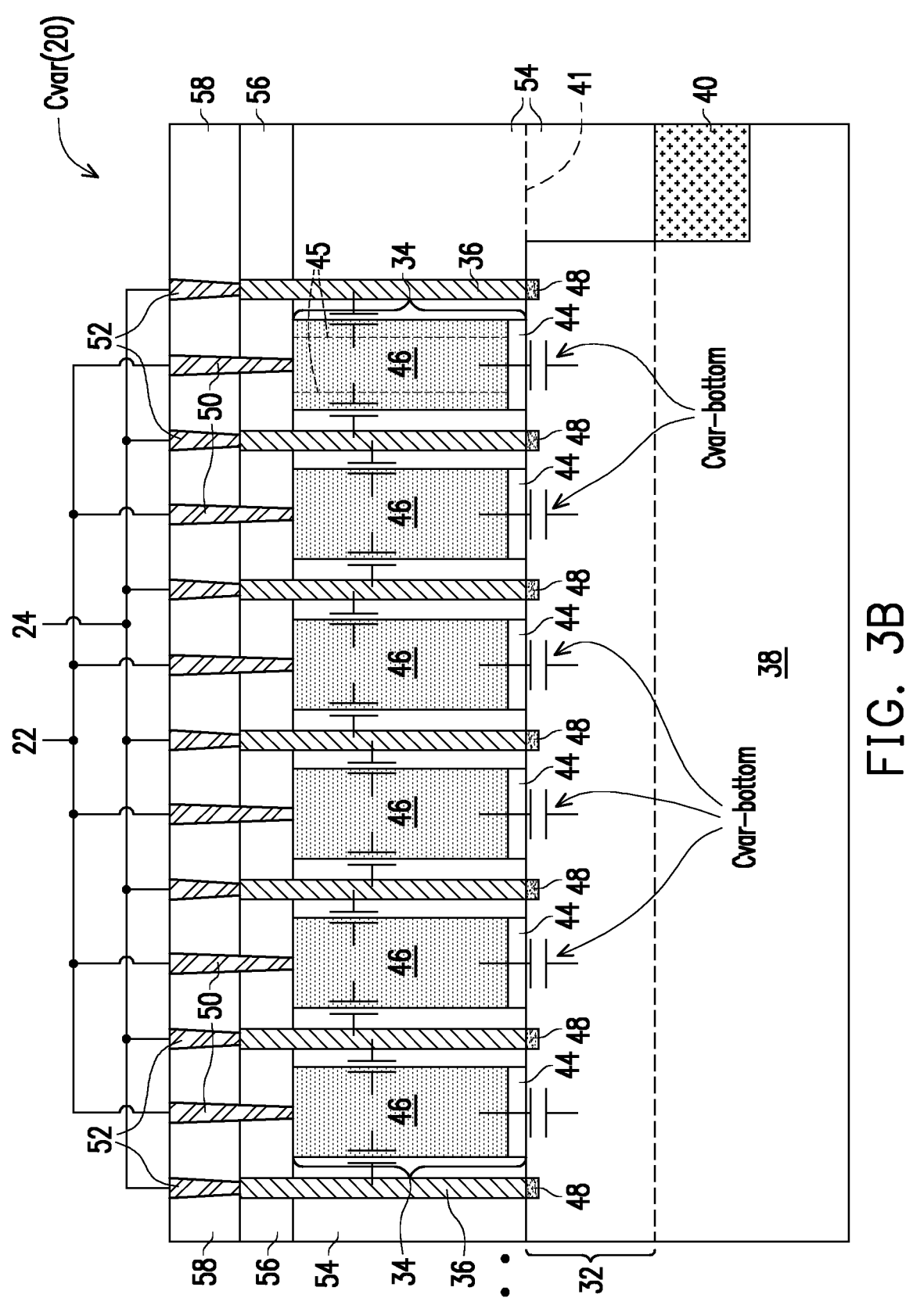

FIG. 3B illustrates a cross-sectional view of the structure shown in FIG. 3A. The cross-sectional view is obtained from the plane containing line 3B-3B in FIG. 3A. In accordance with some embodiments of the present disclosure, capacitor Cvar is formed based on Fin Field-Effect Transistor (FinFET) technology, and the active region 32 includes a semiconductor fin that protrudes higher than STI regions 40. STI regions 40 extend into the underlying semiconductor substrate 38. In accordance with alternative embodiments of the present disclosure, capacitor Cvar is formed based on planar transistor technology, and the respective structure is similar to what is shown in FIG. 3B, except the top surfaces of STI region 40 are at the level marked by dashed line 41, and no semiconductor fins are formed.

Gate stacks 34 include gate dielectrics 44 and gate electrodes 46 over the corresponding gate dielectrics 44. In accordance with some embodiments of the present disclosure, each of gate dielectrics 44 includes an interfacial layer (not shown separately), which may be a silicon oxide layer formed on the surface of the corresponding active region 32. The interfacial layer may be formed by performing a thermal oxidation to convert a surface layer of active region 32 into oxide. Each of gate dielectrics 44 may or may not include a high-k dielectric layer (not shown separately) formed on the interfacial layer. For example, the high-k dielectric layer may be formed of aluminum oxide, zirconium oxide, lanthanum oxide, or the like. In accordance with some embodiments of the present disclosure, gate electrodes 46 are formed of polysilicon or amorphous silicon. When formed of polysilicon or amorphous silicon, gate electrodes 46 may include silicide regions (not shown separately) on top of polysilicon or amorphous silicon in order to reduce the contact resistance between gate electrodes 46 and the overlying contact plugs 50. In accordance with alternative embodiments, gate electrodes 46 are formed of metals, which may include, and not limited to, TiN, TaN, TiAl, cobalt, aluminum, multi-layers thereof, and compounds thereof. Gate electrodes 46 may be formed sharing the same process for forming the gate electrodes of either p-type FinFETs or n-type FinFETs. Accordingly, gate electrodes 46 may have the same structures and comprise same materials as p-type FinFETs or n-type FinFETs.

In addition, the formation of gate stacks 34 may include forming a gate dielectric layer, depositing a gate electrode layer over the gate dielectric layer, and then patterning the gate dielectric layer and the gate electrode layer to form gate stacks 34. The resulting gate stacks 34 are similar to what are shown in FIG. 3B. In accordance with alternative embodiments of the present disclosure, gate stacks 34 are replacement gate stacks, whose formation includes forming dummy gate stacks, forming gate spacers on opposite sides of the dummy gate stacks, etching the dummy gate stacks to leave openings between the gate spacers, and forming replacement gate dielectrics and replacement gate electrodes in the openings. The resulting gate stacks are similar to what are shown FIG. 3B, except that gate dielectrics 44 will also include some sidewall portions on opposite sides of gate electrodes, wherein the sidewall portions are shown by dashed lines 45 in one of the gate stacks 34.

Capacitors Cvar include gate electrodes 46 as the top capacitor plates, gate dielectrics 44 as the capacitor insulators, an active region as a common bottom capacitor plate, which is shared by a plurality of capacitors. The corresponding capacitors are illustrated in FIG. 3B as bottom capacitors Cvar-bottom. Contact plugs 36 are electrically connected to the bottom capacitor plate through silicide regions 48. The entire active region 32 including the portions directly underlying and contact silicide regions 48 and the portions directly underlying gate stacks 34 are of the same conductivity type, which may be either p-type or n-type. Accordingly, the entire active region 32 is of the same conductivity type, and acts as the bottom capacitor plate. On the other hand, the top capacitor plates, which are gate electrodes 46, are physically separated from each other, and are electrically interconnected through contact plugs, vias, metal lines or the like. For example, FIG. 3B illustrates that gate electrodes 46 are connected to contact plugs 50, which are further connected to node 22 (also refer to FIG. 1). Contact plugs 36 may be connected to contact plugs 52, which are connected to node 24 (also refer to FIG. 1). Accordingly, the plurality of capacitors Cvar-bottom are connected in parallel to form parts of decoupling capacitor 20.

FIG. 3B also illustrates some Inter-Layer Dielectrics (ILD) 54, 56, and 58 as examples. Gate stacks 34, contact plugs 36, and contact plugs 50 and 52 are formed in ILDs 54, 56, and 58 as examples. It is appreciated that although three layers of ILDs are illustrated in accordance with some embodiments, there may be two layers of ILDs, for example, when the top surfaces of gate electrodes 46 and contact plugs 36 are at a same level. ILD 54 has portions between neighboring gate electrodes 46 and contact plugs 36. Accordingly, ILD 54 also acts as parts of the capacitor insulators of parasitic capacitors Cvar-side, which are parts of capacitors Cvar. Since the distance from gate electrodes 46 to neighboring contact plugs 36 is much greater than the thickness of gate dielectric s 44, the capacitance of capacitors Cvar-side is smaller than the capacitance of capacitors Cvar-bottom. The capacitance of capacitors Cvar-bottom is thus the major contributor of the capacitance of capacitor Cvar.

Figure 3C:
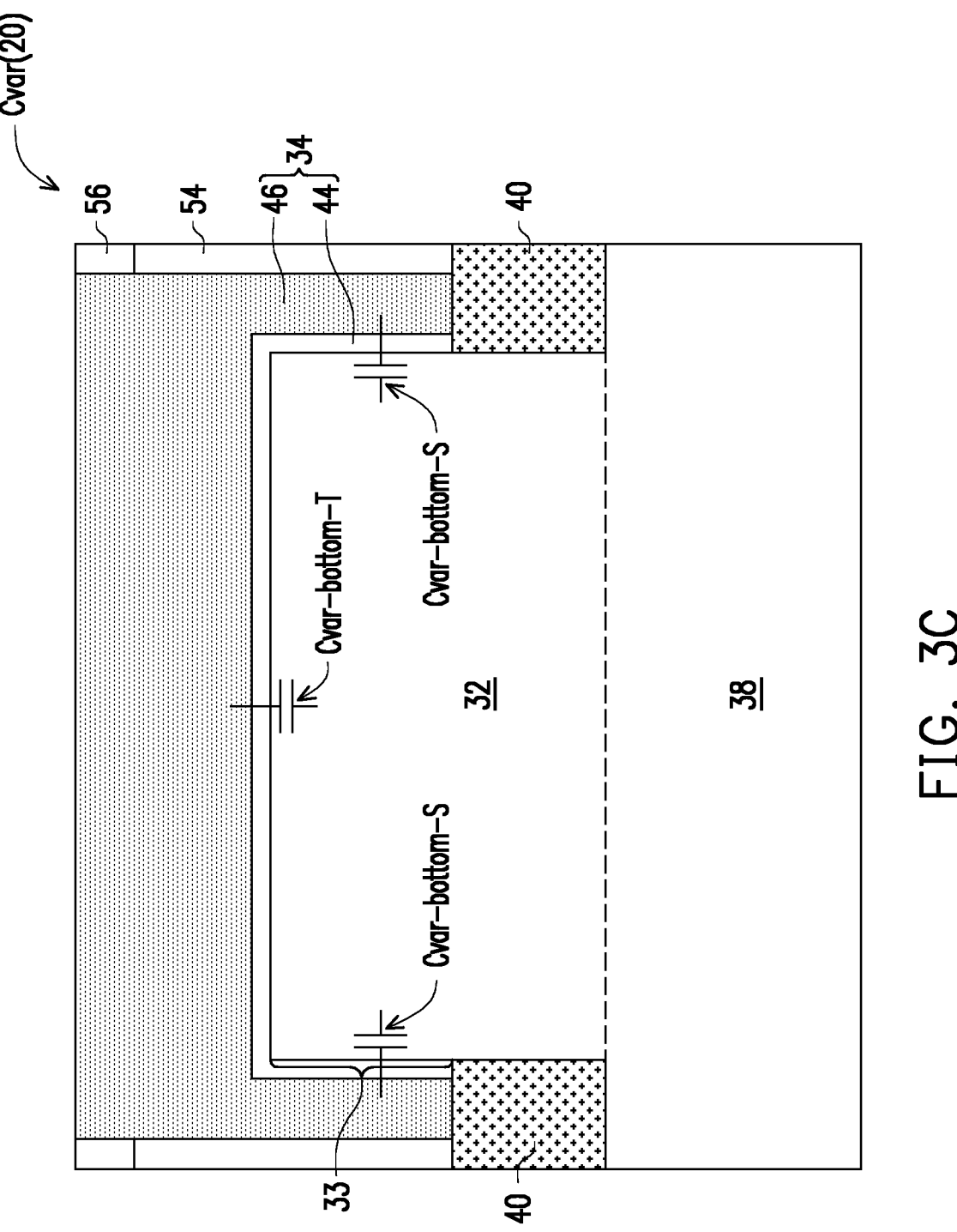

FIG. 3C illustrates a cross-sectional view of the structure shown in FIG. 3A. The cross-sectional view is obtained from the plane containing line 3C-3C in FIG. 3A. In accordance with some embodiments of the present disclosure, active region 32 includes a semiconductor fin 33 protruding higher than the top surfaces of STI regions 40. Gate dielectric 44 extends on the top surface and the sidewalls of semiconductor fin 33. Gate electrode 46 is formed over gate dielectric 44, and has a top portion overlapping semiconductor fin 33, and sidewall portions on opposite sides of semiconductor fin 33. Accordingly, capacitor Cvar-bottom includes top portion Cvar-bottom-T and sidewall portions Cvar-bottom-S. The capacitance of portion Cvar-bottom-T may be about 90 percent or more of the capacitance of capacitor Cvar in accordance with some embodiments.

Since the major contributor of the capacitance in capacitor Cvar is capacitors Cvar-bottom-T, the widths W3 (as shown in FIG. 3A) may be maximized (providing design rules are not violated) to increase the capacitance of capacitor Cvar. The widths of contact plugs 36 are kept small in order to increase the number of gate stacks 34 and contact plugs 36 per unit area. Referring to FIG. 3A, in accordance with some embodiments of the present disclosure, width W3 of gate electrodes 34 is greater than about 5 nm, and may be in the range between about 5 nm and about 40 nm. Width W4 of contact plugs 36 may be smaller than about 100 nm, and may be in the range between about 10 nm and about 100 nm. Furthermore, distance D1 between a gate electrode 34 and its neighboring contact plug 36 may be smaller than about 40 nm, and may be in the range between about 10 nm and about 20 nm.

Figure 3D:
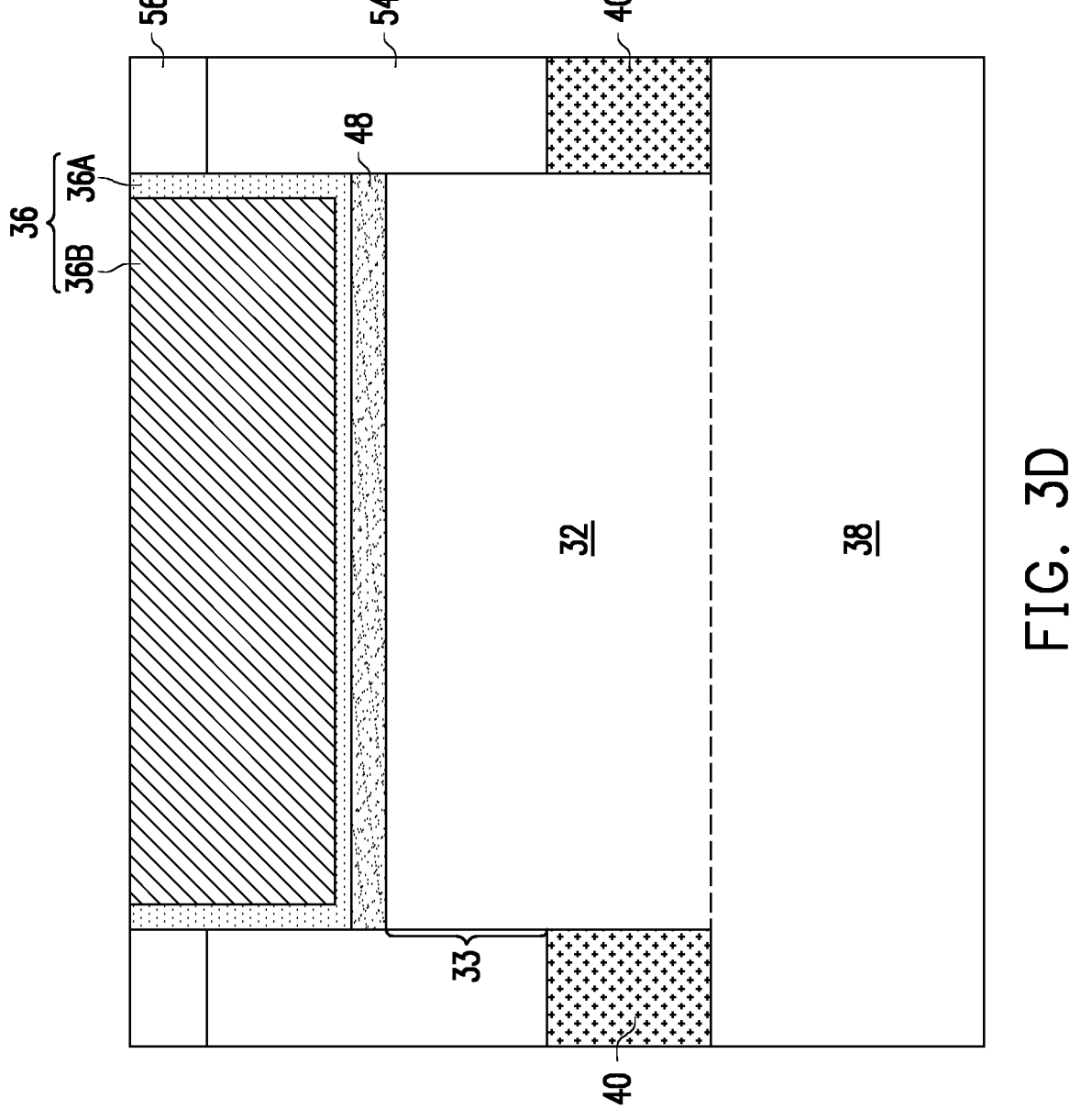
Figure 6:
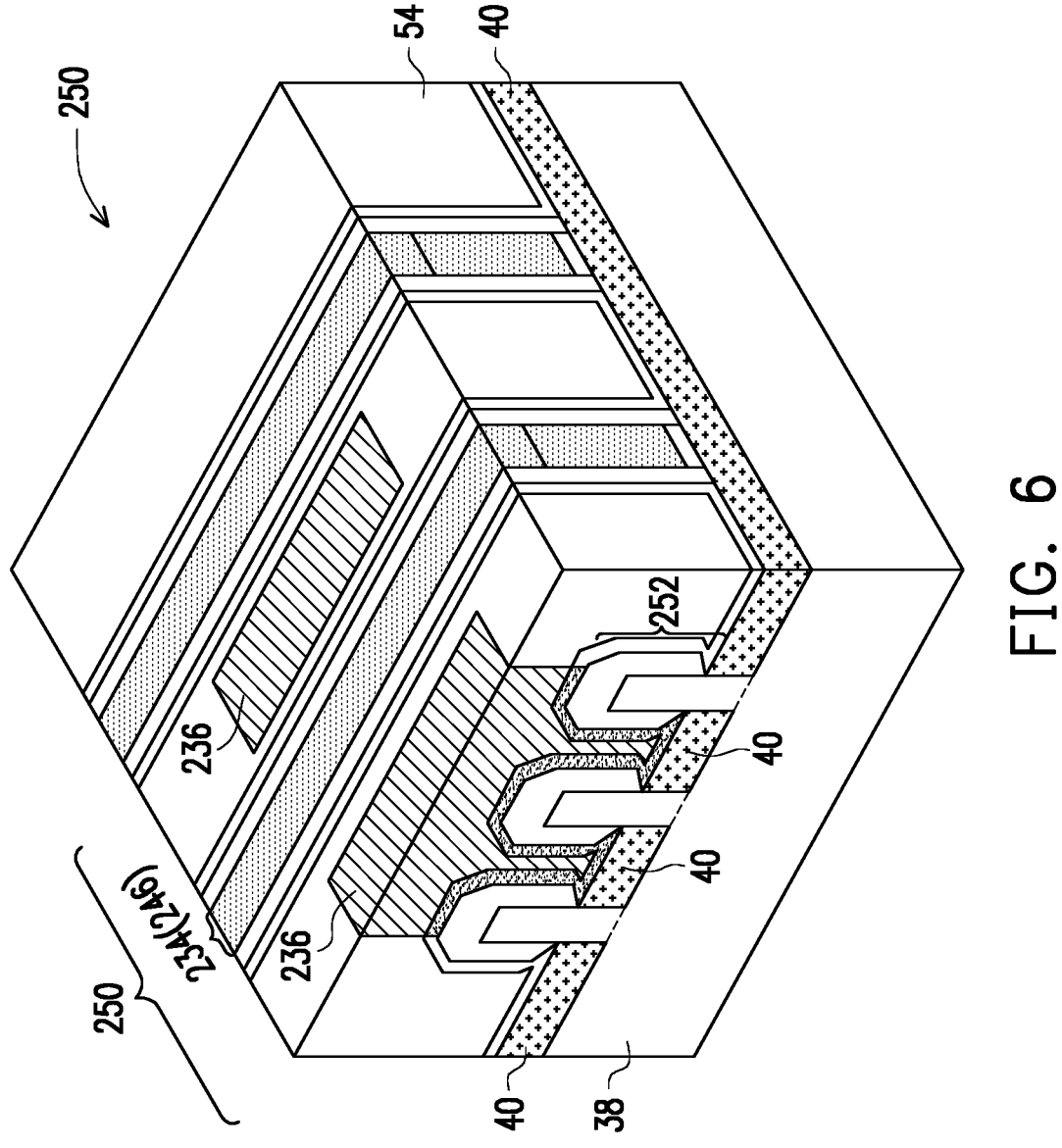
FIG. 6 illustrates a FinFET formed simultaneously as the hybrid decoupling capacitor in accordance with some embodiments.

FIG. 3D illustrates a cross-sectional view of the structure shown in FIG. 3A. The cross-sectional view is obtained from the plane containing line 3D-3D in FIG. 3A. One of contact plug 36 is illustrated in FIG. 3D. In accordance with some embodiments of the present disclosure, contact plug 36 has a length equal to or substantially equal to the length of active region 32, so that the contact area between contact plug 36 and the underlying silicide region 48 is increased to reduce the contact resistance. For example, the length of contact plug 36 may be between about 90 percent and 100 percent of the length of active region 32. Contact plugs 36 may be formed in the same process for forming source/drain contact plugs of the FinFETs on the same die. For example, FIG. 6 illustrates an example of a FinFET 250 formed on the same die as decoupling capacitor 20. FinFET 250 has contact plugs 236. Contact plugs 36 (FIGS. 3A, 3B, 3C, and 3D) may be formed in the same process as, and have the same structure as, source/drain contact plugs 236. In accordance with some embodiments of the present disclosure, contact plugs 36 include barrier layer 36A and metal region 36B over the bottom portion of barrier layer 36A. Barrier layer 36A also includes portions on the opposite sides of metal region 36B. In accordance with some embodiments of the present disclosure, barrier layer 36A is formed of titanium nitride, tantalum nitride, or the like. Metal regions 36B may be formed of tungsten, cobalt, or the like.

Figure 4A:
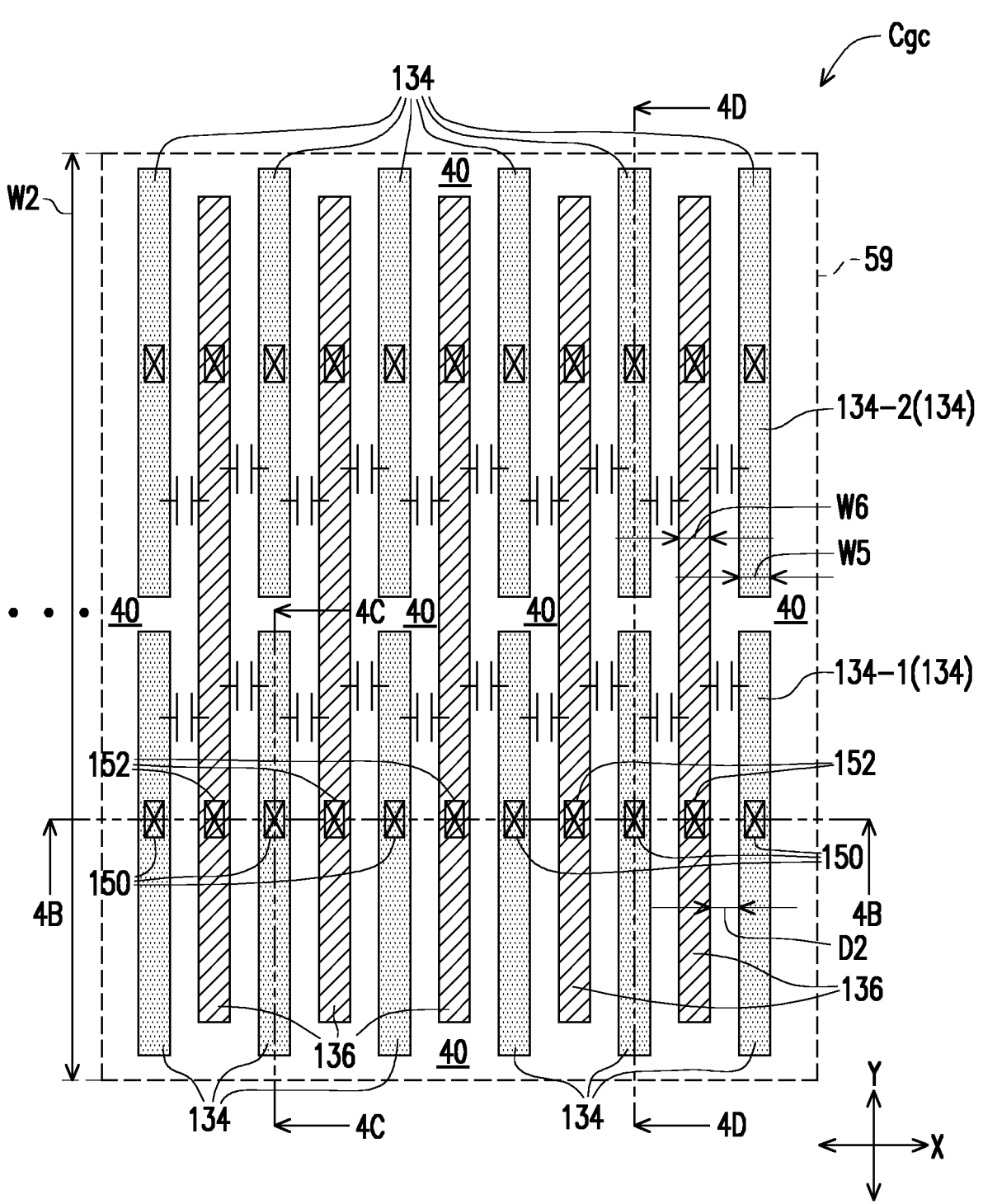
FIGS. 4A, 4B, 4C, and 4D illustrate the top view and cross-sectional views of a comb capacitor in a hybrid decoupling capacitor in accordance with some embodiments.

FIGS. 4A, 4B, 4C, and 4D illustrate a top view and cross-sectional views of a portion of capacitor Cgc. The illustrated portion is obtained from region 58 in FIG. 2. FIG. 4A illustrates a top view of capacitor Cgc. In accordance with some embodiments of the present disclosure, a continuous STI region 40 extends throughout the illustrated region 58. Accordingly, no active region is in the illustrated region 58, and no active region is in capacitor Cgc. STI region 40 may also be a continuous region continuously extending into all of capacitors Cvar and Cgc, as can be found from FIGS. 2, 3A, and 4A. Capacitor Cgc is formed on STI region 40. Capacitor Cgc includes a plurality of elongated gate stacks 134 and a plurality of conductive strips 136, both having lengthwise directions in the Y direction. Conductive strips 136 may be formed of metal, and are referred to as metal strips hereinafter, while they may be formed of other conductive materials. It is appreciated that the term "gate electrodes" is adopted by features 134 since features 134 may be formed simultaneously as the gate electrodes of transistors, and hence may have similar features as the gate electrodes of transistors. Gate stacks 134, however, are not formed over active regions, and do not perform any "gating" function. Gate stacks 134 and metal strips 136 may be limited to the region directly over STI region 40, and do not extend beyond edges of STI region 40.

For example, FIG. 6 illustrates a perspective view of transistor 250, which is formed on the same substrate 38 and in the same device die as capacitors Cvar and Cgc as illustrated in FIGS. 3A and 4A. Gate stacks 134 may be formed simultaneously as the gates 234 of transistor 250. Also, FIG. 6 schematically illustrates source/drain contact plugs 236 connecting to the source/drain regions 252 of transistor 250. Metal strips 136 in FIG. 4A may also be formed simultaneously as source/drain contact plugs 236. Accordingly, metal strips 136 may have the same structure as source/drain contact plugs 236.

In the illustrated examples as shown in FIG. 4A, in the Y direction, there are two gate stacks 134 (for example, 134-1 and 134-2) having lengthwise directions aligned to a same straight line (not shown) extending in the Y direction. In accordance with some embodiments of the present disclosure, the two illustrated gate stacks 134 may be replaced with a single elongated gate electrode extending substantially throughout the width W2 of region 58. In accordance other some embodiments of the present disclosure, the two illustrated gate stacks 134 may be replaced with three or more elongated gate electrodes, which in combination extend substantially throughout the width W2 of region 58. The number of gate stacks 134 aligned to the same straight line is affected by design rules, and fewer gate electrodes are preferred to achieve a higher capacitance, providing design rules are not violated.

In the illustrated examples, in the Y direction, there is a single metal strip 136 extending substantially throughout the width W2 of region 58. In accordance with other embodiments of the present disclosure, the single metal strip 136 is replaced with two, three, or more separate metal strips aligned to a same straight line. The number of metal strip 136 aligned to the same straight line is affected by design rules, and fewer metal strips are preferred to achieve higher capacitance, providing design rules are not violated.

Figure 4B:
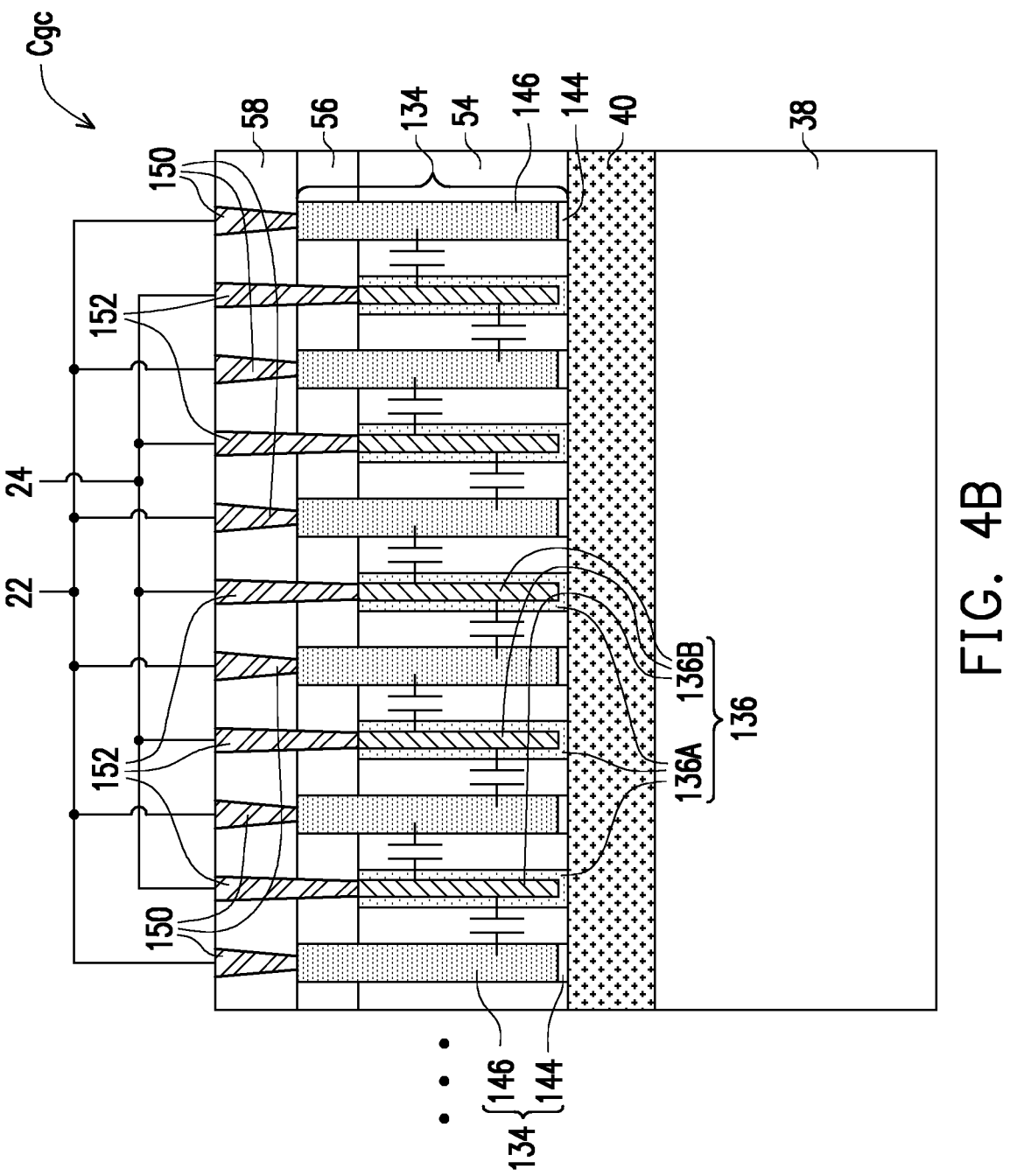

As shown in FIG. 4A, gate stacks 134 and metal strips 136 are laid out alternatingly. Accordingly, each of gate stacks 134 forms capacitors with neighboring metal strip(s) 136, and each of metal strips 136 forms capacitors with neighboring gate stacks 134, which capacitors are illustrated in FIG. 4A. The dielectric material between gate stacks 134 and metal strips 136 acts as the capacitor insulators. The dielectric material includes ILD 54 as shown in FIG. 4B. Gate spacers (not shown) may or may not be formed on the sidewalls of gate electrodes, and the gate spacers, when formed, are also parts of the capacitor insulators. To maximize the capacitance of capacitors Cgc, the thickness of the capacitor insulator needs to be small, which means that the distance between neighboring gate stacks 134 and metal strips 136 are small. For example, distance D2 (FIG. 4A) may be smaller than about 40 nm, and may be in the range between about 10 nm and about 40 nm. The widths of gate stacks 134 and metal strips 136 are also small in order to increase the total number of gate stacks 134 and metal strips 136 and to increase the capacitance of capacitor Cgc. In accordance with some embodiments of the present disclosure, width W5 of gate stacks 134 is smaller than about 40 nm, and may be in the range between about 5 nm and about 20 nm. Width W6 of metal strips 136 may be smaller than about 40 nm, and may be in the range between about 10 nm and about 40 nm.

Comparing capacitor Cvar (FIG. 3A) and capacitor Cgc (4A), since increasing the width W3 of gate electrode 34 and reducing the width W5 of gate electrodes 134 may result in the increase in the capacitance of capacitors Cvar and Cgc, the width W3 of gate stacks 34 (FIG. 3A) is greater than width W5 of gate electrodes 134 (FIG. 4A). In accordance with some embodiments, ratio W3/W5 is greater than 5, and may be greater than 10. In addition, width W4 of contact plugs 36 (FIG. 3A) and width W5 of metal strips 136 (FIG. 4A) are preferably small, and may be designed as the minimum widths allowed by the forming technology in order to maximize the capacitance of Cgc.

FIG. 4B illustrates a cross-sectional view of the structure shown in FIG. 4A. The cross-sectional view is obtained from the plane containing line 4B-4B in FIG. 4A. In accordance with some embodiments of the present disclosure, as shown in FIG. 4B, the bottom surfaces of gate stacks 134 and the bottom surfaces of metal strips 136 are in contact with the top surfaces of STI region 40.

Gate stacks 134 include gate dielectrics 144 and gate electrodes 146 over the corresponding gate dielectrics 144. In accordance with some embodiments of the present disclosure, each of gate dielectrics 144 includes a high-k dielectric layer. In accordance with some embodiments of the present disclosure, gate electrodes 146 are formed of polysilicon or amorphous silicon. When formed of polysilicon or amorphous silicon, gate electrodes 146 may include silicide regions (not shown) on top of polysilicon. In accordance with alternative embodiments, gate electrodes 146 are replacement gate electrodes formed of metals, which may include, and not limited to, TiN, TaN, TiAl, cobalt, aluminum, and compositions thereof. Gate electrodes 146 may be formed simultaneously as either or both of gate electrodes 246 (FIG. 6) and gate electrodes 46 (FIG. 4A).

As shown in FIG. 4B, gate stacks 134, metal strips 136, and contact plugs 150 and 152 are formed in ILDs 54, 56, and 58 as examples. ILD 54 has some portions between neighboring gate electrodes 146 and metal strips 136. Accordingly, ILD 54 also acts as at least a part of the capacitor insulators for capacitors Cgc.

FIG. 4B also illustrates that gate electrodes 146 are connected to contact plugs 150, which are further connected to node 22 (also refer to FIG. 1). Metal strips 136 may be connected to contact plugs 152, which are connected to node 24 (also refer to FIG. 1). Accordingly, a plurality of capacitors are connected in parallel to form capacitor Cgc, which is a part of decoupling capacitor 20.

Figure 4C:
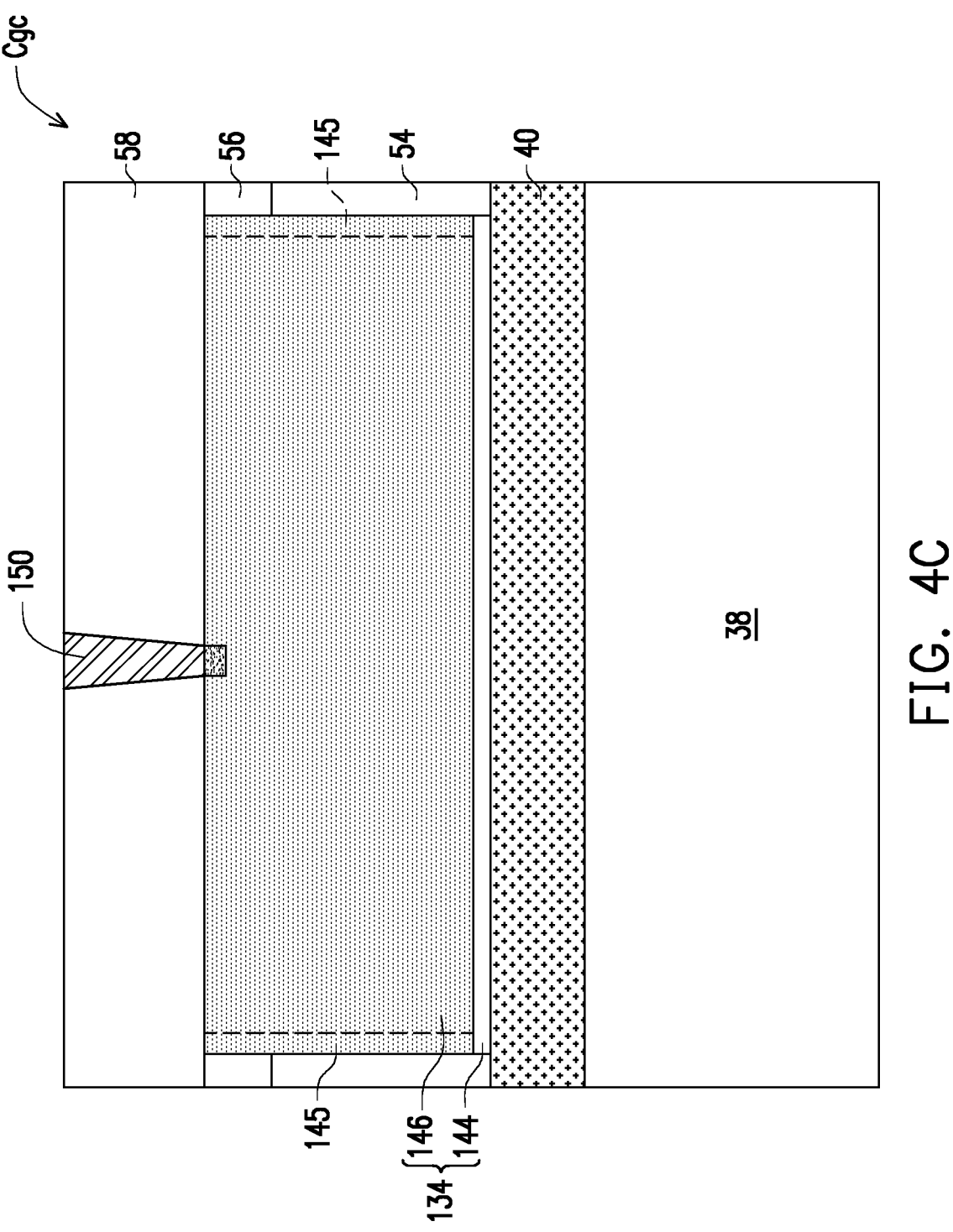

FIG. 4C illustrates a cross-sectional view of the structure shown in FIG. 4A. The cross-sectional view is obtained from the plane containing line 4C-4C in FIG. 4A. Gate dielectric 144 is directly over and in contact with STI region 40. Gate electrode 146 also has a portion overlapping a bottom portion of gate dielectric 144. In accordance with some embodiments, gate dielectrics 144 include sidewall portions (illustrated as dashed regions 145) on opposite sides of gate electrode 146. In accordance with other embodiments, gate dielectrics 144 do not include the dashed regions 145.

Combining FIG. 4C with FIGS. 3C and 2, it is appreciated that STI region 40, on which capacitor Cgc is formed, may be a continuous STI region extending all the way into the region of capacitor Cvar, and extending all the way to the edge of active region 32 (as shown in FIG. 3C).

Figure 4D:
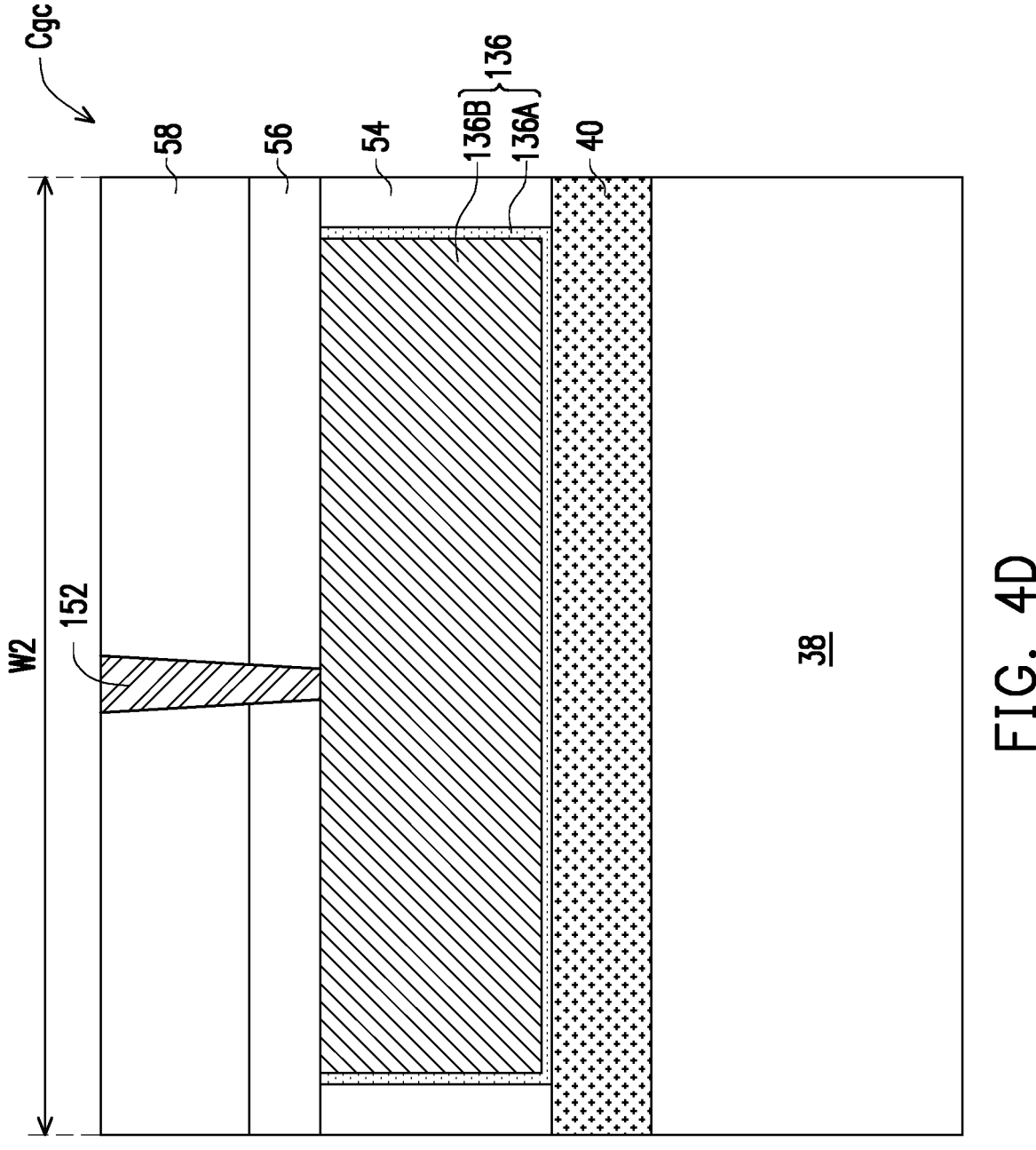

FIG. 4D illustrates a cross-sectional view of the structure shown in FIG. 4A. The cross-sectional view is obtained from the plane containing line 4D-4D in FIG. 4A. Metal strip 136 is illustrated in FIG. 4D. In accordance with some embodiments of the present disclosure, metal strip 136 has a length equal to or substantially equal to but slightly smaller than (for example, greater than about 90 percent and smaller than 100 percent) the width W2 of the corresponding Cgc region, so that the capacitance is maximized. Metal strip 136 may be formed in the same process for forming source/drain contact plugs 236 (FIG. 6) of FinFET 250. Metal strip 136 may thus have the same structure as the source/drain contact plugs 236. In accordance with some embodiments of the present disclosure, metal strips 136 include barrier layer 136A and metal region 136B over the bottom portion of barrier layer 136A.

In accordance with some embodiments of the present disclosure, as shown in FIG. 2, there is only a column (column 1) of capacitors Cvar and Cgc. In accordance with alternative embodiments, there is a plurality of columns (including column 1 and column 2, and possibly more) of capacitors Cvar and Cgc. The second column (column 2) is marked using a dashed box to indicate it may or may not be formed. Each of the columns may duplicate the first column. The capacitors Cvar and Cgc may be allocated as an array. In accordance with some embodiments of the present disclosure, a row of capacitors may be either all capacitors Cvar, or all capacitors Cgc. This design is easy to layout.

Figure 5:
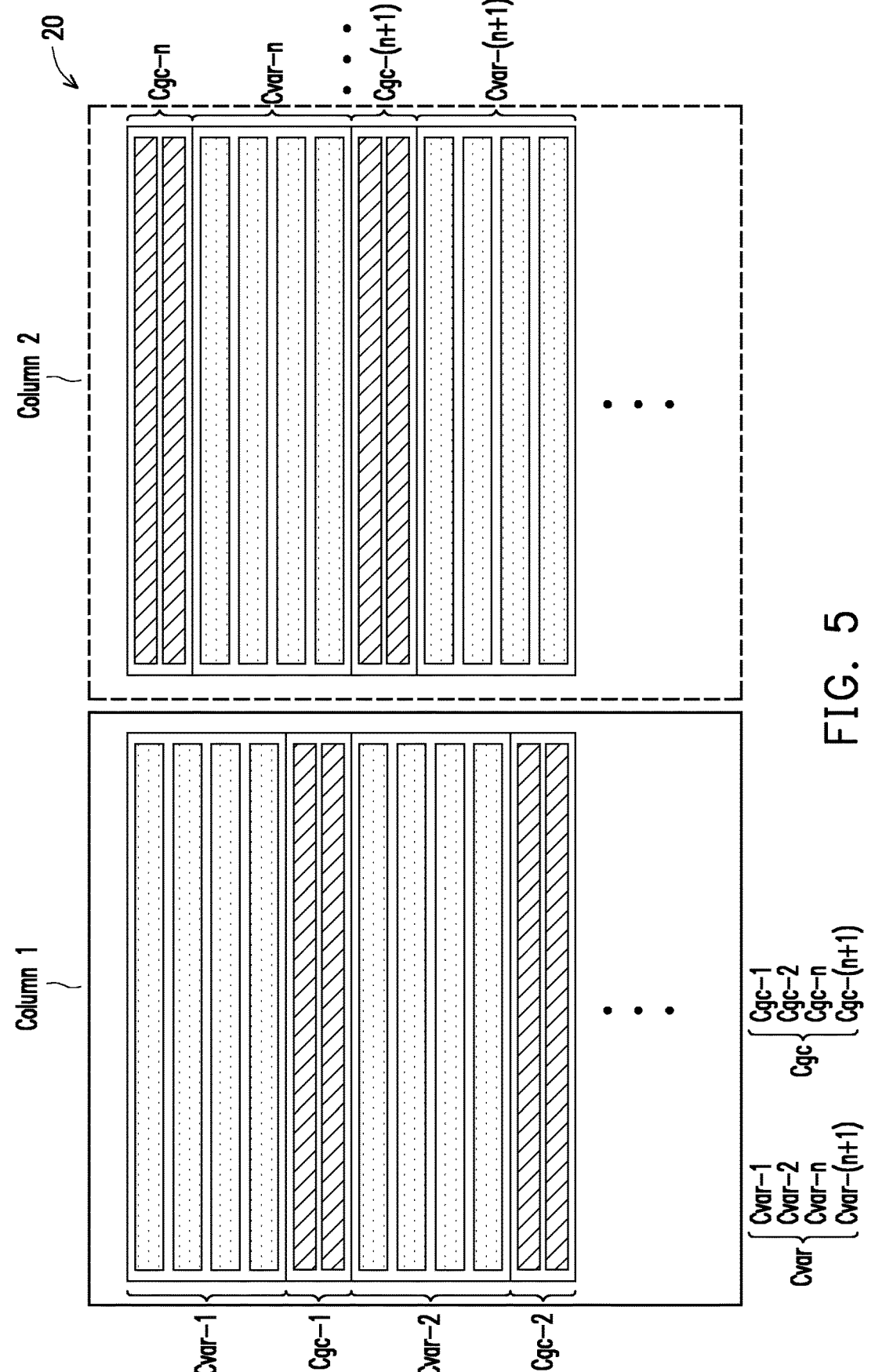
FIG. 5 illustrates a schematic layout of a hybrid decoupling capacitor in accordance with some embodiments.

FIG. 5 illustrates decoupling capacitor 20 in accordance with alternative embodiments. These embodiments are similar to the embodiment shown in FIG. 2, except that column 2 is not a duplicate of column 1. Rather, the capacitors of column 2 are shifted in the Y direction relative to that of column 1.

The embodiments of the present disclosure have some advantageous features. Since the density of active regions in varactors Cvar is high, STI regions are formed neighboring the varactors Cvar to reduce the overall densities of active regions. The chip area of these isolations may be used to form capacitors Cgc, so that these areas are not wasted. The corresponding decoupling capacitors are thus hybrid capacitors. Since the hybrid capacitors are formed sharing the formation process of transistors and their contact plugs, the manufacture cost is not increased. Furthermore, the hybrid decoupling capacitors are at the surface of the semiconductor substrates. The overlying metal layers are not used, and hence can still be used to form more capacitors such as Metal-Oxide-Metal (MOM) capacitors, which can be connected in parallel to the hybrid decoupling capacitor to further increase the capacitance of the resulting decoupling capacitor.

In accordance with some embodiments of the present disclosure, a device includes a first capacitor and a second capacitor connected to the first capacitor in parallel. The first capacitor includes a semiconductor region and a first plurality of gate stacks. The first plurality of gate stacks comprise a plurality of gate dielectrics over and contacting the semiconductor region, and a plurality of gate electrodes over the plurality of gate dielectrics. The second capacitor includes an isolation region, a second plurality of gate stacks over the isolation region, and a plurality of metal strips over the isolation region and parallel to the second plurality of gate stacks. The second plurality of gate stacks and the plurality of metal strips are laid out alternatingly. In an embodiment, the plurality of gate electrodes are electrically connected together, the second plurality of gate stacks are electrically connected together, and the plurality of metal strips are electrically connected together. In an embodiment, the isolation region continuously extends to an edge of the semiconductor region. In an embodiment, the semiconductor region comprises a semiconductor fin, and the first plurality of gate stacks are formed on a top surface and sidewalls of the semiconductor fin. In an embodiment, both the second plurality of gate stacks and the plurality of metal strips are limited in the region directly over the isolation region. In an embodiment, the device further comprises a transistor comprising a gate stack, wherein the transistor is formed on a same semiconductor substrate as the transistor, wherein the first plurality of gate stacks and the second plurality of gate stacks have a same structure as the gate stack of the transistor. In an embodiment, the device further comprises a first plurality of capacitors having identical structures connected to each other in parallel, with the first capacitor comprised in the first plurality of capacitors; and a second plurality of capacitors parallel connected to each other and to the first plurality of capacitors, with the second capacitor comprised in the second plurality of capacitors, wherein the second plurality of capacitors have identical structures. In an embodiment, the first plurality of capacitors and the second plurality of capacitors are allocated alternatingly in a column. In an embodiment, the semiconductor region has a lengthwise direction parallel to a row direction perpendicular to a column direction of the column. In an embodiment, each of the first plurality of capacitors occupies a chip area having a first width, and each of the second plurality of capacitors occupies a chip area having a second width smaller than the first width. In an embodiment, the isolation region is free from active regions therein.

In accordance with some embodiments of the present disclosure, a device includes a semiconductor substrate; an STI region extending into the semiconductor substrate, wherein the STI region comprises: a first portion; and a second portion continuously connected to the first portion; a varactor comprising: an active region encircled by the first portion of the STI region, wherein the active region acts as a bottom capacitor plate of the varactor; a plurality of gate dielectrics over the active region and acting as capacitor insulators of the varactor; and a plurality of gate electrodes over the plurality of gate dielectrics and acting as top capacitor plates of the varactor; and a capacitor comprising a first plurality of conductive strips and a second plurality of conductive strips overlapping the second portion of the STI region, wherein the first plurality of conductive strips and the second plurality of conductive strips are laid out alternatingly, and wherein the capacitor is connected to the varactor in parallel. In an embodiment, the plurality of gate electrodes and the first plurality of conductive strips are formed of same materials and have same structures. In an embodiment, the varactor further comprises a plurality of elongated contact plugs allocated alternatingly with the plurality of gate electrodes, wherein the plurality of elongated contact plugs and the second plurality of conductive strips are formed of same materials and have same structures. In an embodiment, the device further comprises a plurality of varactors having structures identical to the varactor; and a plurality of capacitors having structures identical to the capacitor, wherein the STI region continuously extends into the plurality of varactors and the plurality of capacitors, and wherein the plurality of varactors and the plurality of capacitors are allocated alternatingly in a column. In an embodiment, the plurality of gate electrodes and the first plurality of conductive strips are formed of polysilicon or amorphous silicon. In an embodiment, the plurality of gate electrodes and the first plurality of conductive strips are formed of metal, and each of the plurality of gate dielectrics comprises a bottom portion and side portion over, and connected to opposite ends of, the bottom portion.

In accordance with some embodiments of the present disclosure, a device includes a semiconductor substrate; and an isolation region extending into the semiconductor substrate; a first plurality of capacitors having a same first structure, the first plurality of capacitors comprising varactors, with active regions of the varactors being encircled by the isolation region; and a second plurality of capacitors having a same second structure, the second plurality of capacitors are formed of first conductive strips and second conductive strips overlapping and contacting the isolation region, wherein the first conductive strips and the second conductive strips act as opposite capacitor plates of the second plurality of capacitors, and each of the second plurality of capacitors is allocated between two of the first plurality of capacitors. In an embodiment, the first plurality of capacitors is connected in parallel to the second plurality of capacitors. In an embodiment, the first conductive strips comprises polysilicon or amorphous silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a power supply node and an electrical ground;
a semiconductor substrate;
a first dielectric isolation region extending into the semiconductor substrate;
a capacitor coupled between the power supply node and the electrical ground, wherein the capacitor comprises:
a protruding semiconductor region encircled by, and protruding higher than, the first dielectric isolation region, wherein the protruding semiconductor region comprises:
a first sidewall and a second sidewall parallel to each other; and
a third sidewall and a fourth sidewall parallel to each other, and perpendicular to the first sidewall and the second sidewall;
a first plurality of gate stacks contacting a top surface and the first sidewall and the second sidewall of the protruding semiconductor region, wherein a gate stack in the first plurality of gate stacks overlaps a portion of the protruding semiconductor region to have an overlap region in a top view of the device, and wherein in the top view, the overlap region has a length in a lengthwise direction parallel to the third sidewall, and a width in a widthwise direction parallel to the first sidewall, and wherein the length is greater than the width, and wherein the first plurality of gate stacks are electrically interconnected; and
a plurality of contact plugs electrically interconnected, wherein the first plurality of gate stacks and the plurality of contact plugs are laid out alternatingly; and
a dielectric layer, wherein both of the first plurality of gate stacks and the plurality of contact plugs comprise portions in the dielectric layer.

2. The device of claim 1, wherein an entirety of each of the plurality of contact plugs overlaps the protruding semiconductor region.

3. The device of claim 1 further comprising a plurality of silicide regions between, and contacting, the plurality of contact plugs and underlying portions of the protruding semiconductor region.

4. The device of claim 1, wherein the first sidewall is longer than the third sidewall.

5. The device of claim 1, wherein the first plurality of gate stacks are electrically connected to a first node, and the plurality of contact plugs are connected to a second node, and a first one of the first node and the second node is the power supply node, and a second one of the first node and the second node is the electrical ground.

6. The device of claim 1, wherein the first plurality of gate stacks and the plurality of contact plugs collectively form a varactor.

7. The device of claim 6 further comprising:
a second dielectric isolation region extending into the semiconductor substrate;
a second plurality of gate stacks overlapping the second dielectric isolation region, wherein the second plurality of gate stacks are electrically interconnected; and
a plurality of conductive strips parallel to the second plurality of gate stacks, wherein the plurality of conductive strips are interconnected, and the second plurality of gate stacks and the plurality of conductive strips are alternatingly located, and collectively form an additional capacitor.

8. The device of claim 7 further comprising:
a plurality of varactors having same structures as the varactor; and
a plurality of capacitors having same structures as the additional capacitor, wherein the plurality of varactors and the plurality of capacitors are aligned to a straight line, and are allocated alternatingly.

9. The device of claim 7, wherein entireties of the second plurality of gate stacks and the plurality of conductive strips overlap, and physically contact, the second dielectric isolation region.

10. The device of claim 1, wherein the first plurality of gate stacks and the plurality of contact plugs are elongated, and have a same lengthwise direction parallel to the third sidewall.

11. The device of claim 1, wherein an entirety of the protruding semiconductor region is formed of a same material continuously extending to regions underlying the first plurality of gate stacks and the plurality of contact plugs.

12. A device comprising:
a power supply node and an electrical ground;
a semiconductor substrate;
a Shallow Trench Isolation (STI) region extending into the semiconductor substrate, wherein the STI region comprises:
a first plurality of portions, wherein the first plurality of portions encircle a plurality of semiconductor regions of the semiconductor substrate; and
a second plurality of portions, wherein the first plurality of portions and the second plurality of portions are portions of the STI region that is continuous;
a plurality of varactors, each formed with one of the plurality of semiconductor regions acting as a first capacitor plate, wherein each of the plurality of varactors comprises:
a first plurality of elongate gate electrodes acting as second capacitor plates of the plurality of varactors, each extending on a top surface and opposing sidewalls of one of the plurality of semiconductor regions, wherein in a top view of the device, each of the first plurality of elongated gate electrodes overlaps the one of the plurality of semiconductor regions to form an overlap region, and wherein a lengthwise direction of the overlap region is perpendicular to the opposing sidewalls; and a plurality of contact plugs, each between two neighboring ones of the first plurality of elongated gate electrodes, wherein the plurality of contact plugs are electrically connected to the plurality of semiconductor regions, wherein the plurality of varactors are connected in parallel as a capacitor, and wherein the capacitor is coupled between the power supply node and the electrical ground; and an inter-layer dielectric, wherein the first plurality of elongate gate electrodes and the plurality of contact plugs comprise portions in the inter-layer dielectric.

13. The device of claim 12, wherein the plurality of varactors have same structures and same dimensions.

14. The device of claim 12, wherein the plurality of varactors are electrically connected in parallel.

15. The device of claim 12 further comprising a plurality of capacitors, each overlapping one of the second plurality of portions of the STI region, the plurality of capacitors comprising:

a second plurality of gate electrodes acting as third capacitor plates of the plurality of capacitors; and a plurality of conductive strips acting as fourth capacitor plates of the plurality of capacitors.

16. The device of claim 15, wherein the second plurality of gate electrodes are in the inter-layer dielectric.

17. A device comprising:

a power supply node and an electrical ground;

a semiconductor substrate;

a dielectric isolation region extending into the semiconductor substrate, wherein the semiconductor substrate comprises a protruding semiconductor fin protruding higher than and encircled by the dielectric isolation region; and a capacitor coupled between the power supply node and the electrical ground, the capacitor comprising:

a plurality elongate gate electrodes, with each of the plurality of elongate gate electrodes extending on the protruding semiconductor fin;

a plurality of elongated silicide regions at surfaces of the protruding semiconductor fin; and a plurality of elongated contact plugs over and contacting the plurality of elongated silicide regions, wherein the plurality of elongate gate electrodes and the plurality of elongated contact plugs are alternatingly situated, and wherein lengthwise directions of the plurality of elongate gate electrodes and the plurality of elongated contact plugs are parallel to each other.

18. The device of claim 17, wherein one of the plurality elongate gate electrodes has a first lengthwise direction perpendicular to a second lengthwise direction of the protruding semiconductor fin.

19. The device of claim 17, wherein each of the plurality of elongate gate electrodes extends on a top surface and opposing sidewalls of the protruding semiconductor fin.

20. The device of claim 17, wherein one of the plurality of elongate gate electrodes is between two contact plugs in the plurality of elongated contact plugs, and wherein a distance between the two contact plugs is smaller than a length of the one of the plurality of elongate gate electrodes.

* * * * *